(12) United States Patent
Liu et al.

(10) Patent No.: US 11,469,260 B2
(45) Date of Patent: Oct. 11, 2022

(54) DISPLAY SUBSTRATE, METHOD FOR PREPARING THE SAME, AND DISPLAY DEVICE

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Ning Liu, Beijing (CN); Bin Zhou, Beijing (CN); Jun Liu, Beijing (CN); Yang Zhang, Beijing (CN); Tongshang Su, Beijing (CN); Haitao Wang, Beijing (CN)

(73) Assignees: HEFEI XINSHENG OPTOELECTRONICS TECHNOLOGY CO., LTD., Anhui (CN); Beijing BOE Technology Development Co., Ltd., Beijing (CN)

( * ) Notice: Subject to any disclaimer, the term of this patent is extended or adjusted under 35 U.S.C. 154(b) by 335 days.

(21) Appl. No.: 16/761,231

(22) PCT Filed: Oct. 28, 2019

(86) PCT No.: PCT/CN2019/113588
§ 371 (c)(1),
(2) Date: May 1, 2020

(87) PCT Pub. No.: WO2020/108196
PCT Pub. Date: Jun. 4, 2020

(65) Prior Publication Data
US 2021/0313356 A1    Oct. 7, 2021

(30) Foreign Application Priority Data
Nov. 27, 2018  (CN) .......................... 201811424979.X (51) Int. Cl.
*H01L 27/12* (2006.01)
*G03F 7/00* (2006.01)
(Continued)

(52) U.S. Cl.
CPC ........ *H01L 27/1288* (2013.01); *G03F 7/0007* (2013.01); *G03F 7/16* (2013.01);
(Continued)

(58) Field of Classification Search
CPC ......... H01L 21/31144; H01L 21/32139; H01L 27/124; H01L 27/1288; H01L 29/7869
See application file for complete search history.

(56) References Cited

U.S. PATENT DOCUMENTS

| 2003/0057518 A1 | 3/2003 | Schaper et al. |
| 2005/0142896 A1* | 6/2005 | Imai ..................... B05C 5/0279 |
| | | 438/795 |

(Continued)

FOREIGN PATENT DOCUMENTS

| CN | 1647258 A | 7/2005 |
| CN | 101136376 A | 3/2008 |

(Continued)

OTHER PUBLICATIONS

ISA China National Intellectual Property Administration, International Search Report Issued in Application No. PCT/CN2019/113588, dated Jan. 23, 2020, WIPO, 16 pages. (Submitted with Partial Translation).

(Continued)

*Primary Examiner* — Jaehwan Oh
(74) *Attorney, Agent, or Firm* — McCoy Russell LLP (57) ABSTRACT

The present disclosure provides a display substrate, a method for preparing the same, and a display device including the display substrate. The method includes: forming a conductive layer; forming a first photoresist pattern and a (Continued)

second photoresist pattern on the conductive layer, in which the adhesion between the first photoresist pattern and the conductive layer is less than the adhesion between the second photoresist pattern and the conductive layer; and etching the conductive layer by using the first photoresist pattern and the second photoresist pattern as masks to form a first conductive pattern and a second conductive pattern, respectively, in which a line width difference between the first conductive pattern and the first photoresist pattern is greater than a line width difference between the second conductive pattern and the second photoresist pattern.

17 Claims, 3 Drawing Sheets

(51) Int. Cl.
  *G03F 7/16* (2006.01)
  *H01L 21/311* (2006.01)
  *H01L 21/3213* (2006.01)
(52) U.S. Cl.
  CPC ...... *H01L 27/124* (2013.01); *H01L 21/31144* (2013.01); *H01L 21/32139* (2013.01); *H01L 27/1225* (2013.01)

(56) References Cited

U.S. PATENT DOCUMENTS

| | | | |
|---|---|---|---|
| 2005/0153483 A1 | | 7/2005 | Groenhuis et al. |
| 2015/0187898 A1* | | 7/2015 | Miyairi ............... H01L 27/1225 |
| | | | 257/762 |
| 2017/0125546 A1 | | 5/2017 | Huang et al. |

FOREIGN PATENT DOCUMENTS

| | | |
|---|---|---|
| CN | 104716092 A | 6/2015 |
| CN | 106057667 A | 10/2016 |
| CN | 107895726 A | 4/2018 |
| CN | 108231797 A | 6/2018 |
| CN | 109712930 A | 5/2019 |
| JP | 2002026332 A | 1/2002 |
| TW | 493095 B | 7/2002 |

OTHER PUBLICATIONS

State Intellectual Property Office of the People's Republic of China, Office Action and Search Report Issued in Application No. 201811424979.X, dated Apr. 29, 2020, 10 pages. (Submitted with Partial Translation).

* cited by examiner

DISPLAY SUBSTRATE, METHOD FOR PREPARING THE SAME, AND DISPLAY DEVICE

CROSS-REFERENCE TO RELATED APPLICATIONS

The present application is a U.S. National Phase of International Application No. PCT/CN2019/113588 filed on Oct. 28, 2019, which claims a priority to Chinese Patent Application No. 201811424979.X filed on Nov. 27, 2018. The entire contents of each of the above-listed applications are hereby incorporated by reference for all purposes.

TECHNICAL FIELD

The present disclosure relates to the field of display technology, in particular, to a display substrate and a method for preparing the same, and a display device including the display substrate.

BACKGROUND

The top-gate type thin film transistor (TFT) has the characteristics of a short channel, so that the on-state current thereof $I_{on}$ can be effectively improved. Therefore, when it is used in a display substrate, it can significantly improve the display effect and effectively reduce power consumption. Moreover, since the top-gate type TFT has a small overlap area between the gate electrode and the source and drain electrodes, the generated parasitic capacitance is small, and the possibility of occurrence of defects such as short-circuiting of the gate electrode and the drain electrode (GDS) is also reduced. Since the top-gate type TFT has the above-mentioned remarkable advantages, it is getting more and more attention.

SUMMARY

In one aspect, a method for preparing a display substrate is provided, including: forming a conductive layer; forming a first photoresist pattern and a second photoresist pattern on the conductive layer, in which the adhesion between the first photoresist pattern and the conductive layer is less than the adhesion between the second photoresist pattern and the conductive layer; and etching the conductive layer by using the first photoresist pattern and the second photoresist pattern as masks to form a first conductive pattern and a second conductive pattern, respectively, in which a line width difference between the first conductive pattern and the first photoresist pattern is greater than a line width difference between the second conductive pattern and the second photoresist pattern.

Optionally, an orthogonal projection of the first conductive pattern on the base substrate of the display substrate falls within an orthogonal projection of the first photoresist pattern on the base substrate, and an orthogonal projection of the second conductive pattern on the base substrate of the display substrate falls within an orthogonal projection of the second photoresist pattern on the base substrate.

Optionally, an orthogonal projection of a central axis of the first conductive pattern in an extending direction thereof on the base substrate coincides with an orthogonal projection of a central axis of the first photoresist pattern in an extending direction thereof on the base substrate.

Optionally, an orthogonal projection of a central axis of the second conductive pattern in an extending direction on the base substrate coincides with an orthogonal projection of a central axis of the second photoresist pattern in an extending direction on the base substrate.

Optionally, components of the first photoresist pattern and the second photoresist pattern include a base material, a photosensitive material, and a solvent material, a density of polar groups contained in the base material of a portion of the first photoresist pattern in contact with the conductive layer is greater than a density of polar groups contained in the base material of a portion of the second photoresist pattern in contact with the conductive layer.

Optionally, the polar group is a hydroxyl group (—OH) and/or a carboxyl group (—COOH).

Optionally, the base material in the first photoresist pattern and the second photoresist pattern is a phenol resin containing different amounts of polar groups.

Optionally, the forming the first photoresist pattern and the second photoresist pattern on the conductive layer includes: coating a first photoresist layer on the conductive layer, and exposing and developing the first photoresist layer to form a second photoresist transition pattern; coating a second photoresist layer on the conductive layer and the second photoresist transition pattern, in which an adhesion between the first photoresist layer and the conductive layer is greater than an adhesion between the second photoresist layer and the conductive layer; and exposing and developing the second photoresist layer to form the first photoresist pattern, in which the second photoresist transition pattern and the second photoresist layer remaining on the second photoresist transition pattern constitute the second photoresist pattern.

Optionally, the conductive layer is a gate metal layer, the first conductive pattern is a gate electrode of a thin film transistor, and the second conductive pattern is a gate wiring.

Optionally, the preparation method specifically includes: forming an active layer of the thin film transistor; forming a gate insulation layer, in which the gate insulation layer covers the active layer; forming the gate metal layer on the gate insulation layer; forming the first photoresist pattern and the second photoresist pattern on the gate metal layer; etching the gate metal layer by using the first photoresist pattern and the second photoresist pattern as masks to form the gate and the gate wiring, respectively; etching the gate insulation layer by using the first photoresist pattern and the second photoresist pattern as masks to form a pattern of the gate insulation layer; performing a conductorization process on the active layer using the first photoresist pattern as a mask; and removing the first photoresist pattern and the second photoresist pattern.

Optionally, a line width difference between the first conductive pattern and the first photoresist pattern is 1.5 μm to 2.5 μm, and a line width difference between the second conductive pattern and the second photoresist pattern is 0.5 μm to 1.2 μm.

In another aspect, the present disclosure also provides a display substrate prepared by the method described above.

Optionally, the first conductive pattern is a gate electrode of a thin film transistor, and the second conductive pattern is a gate wiring.

Optionally, an orthogonal projection of the gate electrode of the thin film transistor on the base substrate of the display substrate falls within an orthogonal projection of the gate insulation layer of the thin film transistor on the base substrate.

In yet another aspect, the present disclosure also provides a display device including the display substrate as described above.

DETAILED DESCRIPTION

In order to make the technical problems to be solved, the technical solutions, and the advantages of the embodiments of the present disclosure clearer, the present disclosure will be described hereinafter in conjunction with the drawings and specific examples.

Figure 1:
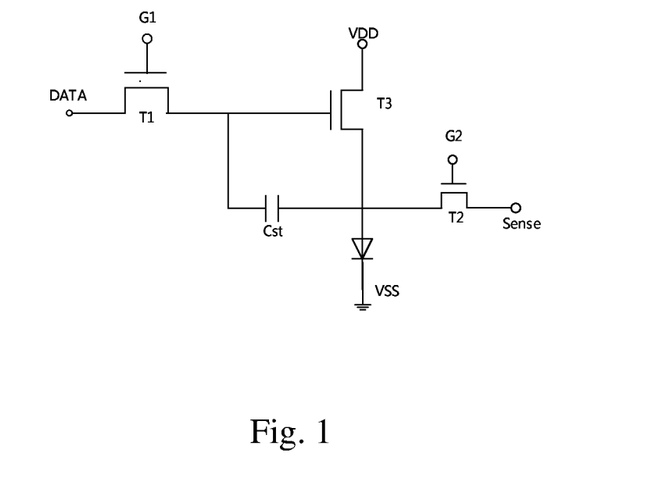
FIG. 1 is a schematic view showing a top-gate type AMOLED product using a 3T1C structure.
Figure 2:
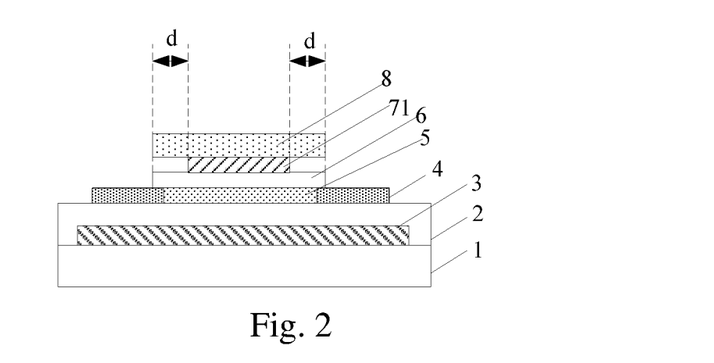
FIG. 2 is a schematic view showing a line width difference between a gate electrode and a photoresist above.

Top-gate type thin film transistor (TFT) has attracted more and more attention, because they have excellent display effects, low power consumption, and reduced possibility of defects such as short-circuiting of the gate electrode and the drain electrode (GDS). In the circuit design of a top-gate type active matrix organic light emitting diode (AMOLED) product, a 3T1C structure as shown in FIG. 1 is often used, and an IGZO semiconductor is used as an active layer. In the actual preparation process, as shown in FIG. 2, after the patterning process of the gate electrode 71 is completed, the photoresist above the gate electrode 71 is not stripped, and the gate insulation layer 6 under the gate electrode 71 is etched by a self-alignment process, followed by a conductorization process on the active layer 5. In order to prevent the lateral diffusion of He plasma in the channel and the diffusion of the metal atoms of the upper gate electrode 71 into the channel through the two ends of the active layer during the conductorization process, it is necessary to make the line width difference 2d between the gate electrode 71 after etching and the remaining photoresist 8 above to be large, that is, the formed critical dimension deviation (CD bias) is relatively large. When the CD bias is relatively large, the photoresist 8 can better protect the gate insulation layer 6 under the gate electrode 71 from being etched, and thus has a certain protection limitation effect on the conductorization process of the active layer 5, and can effectively avoid the lateral diffusion of He plasma in the channel and the diffusion of the metal atoms of the upper gate electrode into the channel through the two ends of the active layer during the conductorization process, thereby ensuring the stability of the performance of the thin film transistor.

As display products gradually develop to large size and high pixel density (PPI), the density of metal wiring is getting larger and larger. Therefore, it is necessary that the line width dimension of the photoresist formed after exposure is as close as possible to the line width dimension of the metal wiring formed after etching, that is, the smaller the CD bias, the better. In addition, when the related art uses the same layer of metal to prepare the gate electrode and gate wiring of the thin film transistor, the CD bias for preparing the gate is same as the CD bias for preparing the gate wiring, which makes it impossible to balance the performance of the thin film transistor and the density of the metal wiring.

Embodiments of the present disclosure are directed to the above problems, and provide a display substrate, a method for preparing the same, and a display device including the display substrate, which is capable of balancing the performance of the thin film transistor and density of the metal wiring.

According to an embodiment of the present disclosure, a method for preparing a display substrate includes: forming a conductive layer; forming a first photoresist pattern and a second photoresist pattern on the conductive layer, in which the adhesion between the first photoresist pattern and the conductive layer is less than the adhesion between the second photoresist pattern and the conductive layer; and etching the conductive layer by using the first photoresist pattern and the second photoresist pattern as masks, to form a first conductive pattern and a second conductive pattern, respectively, in which a line width difference between the first conductive pattern and the first photoresist pattern is greater than a line width difference between the second conductive pattern and the second photoresist pattern.

Figure 6:
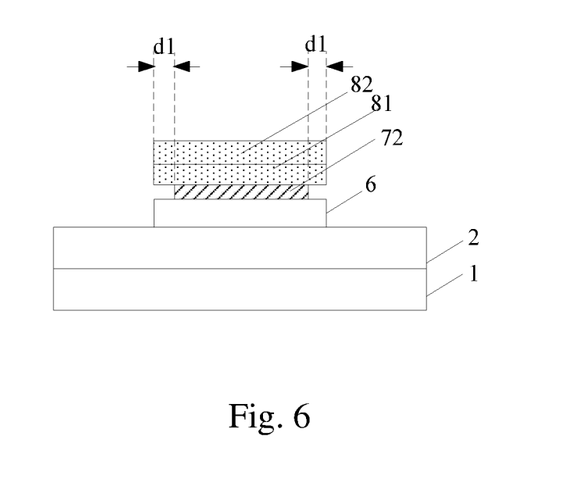
FIG. 6 is a schematic view showing a structure of a gate wiring formed by a method according to an embodiment of the present disclosure.

The line width of each pattern refers to the width of the pattern in a direction perpendicular to the extending direction thereof, and the line width difference between the two patterns is the difference between the line width of one pattern and the line width of the other pattern. For example, in conjunction with FIG. 8 and as shown in FIGS. 2 and 6, the line width of the gate wiring 72 refers to the width of the gate wiring in the A-A straight direction (the direction is perpendicular to the length extension direction of the gate wiring 72), and the line width of the gate electrode 71 refers to the width of the gate electrode 71 in the B-B straight direction (the direction is perpendicular to the length extension direction of the gate electrode 71).

The embodiments of the present disclosure can produce the following advantageous technical effects.

In the above embodiment, since the adhesion between the first photoresist pattern and the conductive layer is less than the adhesion between the second photoresist pattern and the conductive layer, it is relatively easy for the etching solution in the metal layer etching process to enter the angle between the first photoresist pattern and the metal layer for lateral etching, so that the line width difference between the first conductive pattern formed after the etching and the first photoresist pattern is relatively large. In contrast, since the adhesion between the second photoresist pattern and the conductive layer is good, it is difficult for the etching solution in the metal layer etching process to enter the angle between the second photoresist pattern and the metal layer for lateral etching, so that the line width difference between the second conductive pattern formed after the etching and the second photoresist pattern is relatively small Therefore, a line width difference between the first conductive pattern and the first photoresist pattern is greater than a line width difference between the second conductive pattern and the second photoresist pattern. When the first conductive pattern is a gate electrode and the second conductive pattern is a gate wiring, the line width difference between the gate electrode and the first photoresist pattern on the gate electrode is relatively large, and the line width difference between the gate wiring and the second photoresist pattern on the gate wiring is relatively small, thereby satisfying both the performance requirements of the thin film transistor and the wiring density requirements of the metal.

Optionally, an orthogonal projection of the first conductive pattern on the base substrate of the display substrate falls within an orthogonal projection of the first photoresist pattern on the base substrate, and an orthogonal projection of the second conductive pattern on the base substrate of the display substrate falls within an orthogonal projection of the second photoresist pattern on the base substrate.

Optionally, an orthogonal projection of a central axis of the first conductive pattern in an extending direction thereof on the base substrate coincides with an orthogonal projection of a central axis of the first photoresist pattern in an extending direction thereof on the base substrate.

Optionally, an orthogonal projection of a central axis of the second conductive pattern in an extending direction thereof on the base substrate coincides with an orthogonal projection of a central axis of the second photoresist pattern in an extending direction thereof on the base substrate.

Optionally, both the first photoresist pattern and the second photoresist pattern use a positive photoresist. The positive photoresist may include: 1) a base material, for example, phenolic resin, etc., which is the skeleton of a positive photoresist and can enhance the strength of the positive photoresist; 2) a photosensitive material, for example, O-nitrine quinone, etc., which is the main body of the photochemical reaction and becomes soluble in the developer after the photochemical reaction; and 3) a solvent material, such as xylene and various acetates (for example, PGMEA: propylene glycol monomethyl ether acetate), etc., which can adjust the viscosity of the photoresist.

Optionally, the photosensitive material and the solvent material of the first photoresist pattern and the second photoresist pattern may be the same, but the base materials are different. The more the polar groups contained in the base material used, for example, the higher the content of hydroxyl (—OH), carboxyl (—COOH), etc., the worse the adhesion of the photoresist to the metal; in contrast, the less the polar groups contained in the base material used, the better its adhesion to the metal. Therefore, a density of polar groups contained in the base material of a portion of the first photoresist pattern in contact with the conductive layer is greater than a density of polar groups contained in the base material of a portion of the second photoresist pattern in contact with the conductive layer.

Optionally, the forming the first photoresist pattern and the second photoresist pattern on the conductive layer specifically includes: coating a first photoresist layer on the conductive layer, and exposing and developing the first photoresist layer to form a second photoresist transition pattern; coating a second photoresist layer on the conductive layer and the second photoresist transition pattern, in which an adhesion of the first photoresist layer to the conductive layer is greater than an adhesion of the second photoresist layer to the conductive layer; and exposing and developing the second photoresist layer to form the first photoresist pattern, in which the second photoresist transition pattern and the second photoresist layer remaining on the second photoresist transition pattern constitute the second photoresist pattern.

In the embodiment of the present disclosure, a second photoresist pattern is formed by a first photoresist layer and a second photoresist layer, and a first photoresist pattern is formed by a second photoresist layer. Since the first photoresist layer is in contact with the conductive layer in the second photoresist pattern and the second photoresist layer is in contact with the conductive layer in the first photoresist pattern, the adhesion between the first photoresist layer and the conductive layer is greater than the adhesion between the second photoresist layer and the conductive layer. Therefore, the adhesion between the first photoresist pattern and the conductive layer is less than the adhesion between the second photoresist pattern and the conductive layer.

In an embodiment of the present disclosure, the conductive layer is a gate metal layer, the first conductive pattern is a gate electrode of a thin film transistor, and the second conductive pattern is a gate wiring.

In this embodiment of the present disclosure, after the gate metal layer is etched, the line width difference between the formed gate electrode and the remaining first photoresist pattern above is relatively large, thereby meeting the performance requirements of the thin film transistor; and the line width difference between the formed gate wiring and the remaining second photoresist pattern above is relatively small, thereby meeting the wiring requirements of the gate wiring and improving the wiring density of the gate wiring. Therefore, the method according to the embodiment of the present disclosure improves the product quality of the display substrate.

Optionally, the display substrate adopts a 3T1C structure. In the 3T1C structure, the gate wiring includes the wirings connected to G1 and G2, and a part of the wirings serving as VDD (power supply drain) and Sense (compensation) lines.

Optionally, the preparation method specifically includes: forming an active layer of the thin film transistor; forming a gate insulation layer, in which the gate insulation layer covers the active layer; forming the gate metal layer on the gate insulation layer; forming the first photoresist pattern and the second photoresist pattern on the gate metal layer; etching the gate metal layer by using the first photoresist pattern and the second photoresist pattern as masks to form the gate electrode and the gate wiring, respectively; etching the gate insulation layer by using the first photoresist pattern and the second photoresist pattern as masks to form a pattern of the gate insulation layer, in which since the line width difference between the gate electrode and the remaining photoresist pattern is relatively large, the first photoresist pattern is capable of better protecting the gate insulation layer below the gate electrode from being etched, so that the line width difference between the gate electrode and the gate insulation layer below will also be relatively large; performing a conductorization process on the active layer using the first photoresist pattern as a mask, in which since the line width difference between the gate electrode and the gate insulation layer below will be relatively large, the gate insulation layer may have a certain protection limitation effect on the conductorization process of the active layer below, and can effectively avoid the lateral diffusion of He plasma in the channel and the diffusion of the metal atoms of the upper gate electrode into the channel through the two ends of the active layer during the conductorization process, thereby ensuring the stability of the performance of the thin film transistor; and removing the first photoresist pattern and the second photoresist pattern.

In the embodiment of the present disclosure, a line width difference between the first conductive pattern and the first photoresist pattern can be 1.5 µm to 2.5 µm, which can meet the performance requirements of the thin film transistor; and a line width difference between the second conductive pattern and the second photoresist pattern can be 0.5 μm to 1.2 μm, which can meet the density requirements of the metal wiring.

The method for preparing the display substrate of the present disclosure will be described in detail below in conjunction with the accompanying drawings and specific embodiments.

Figure 3:
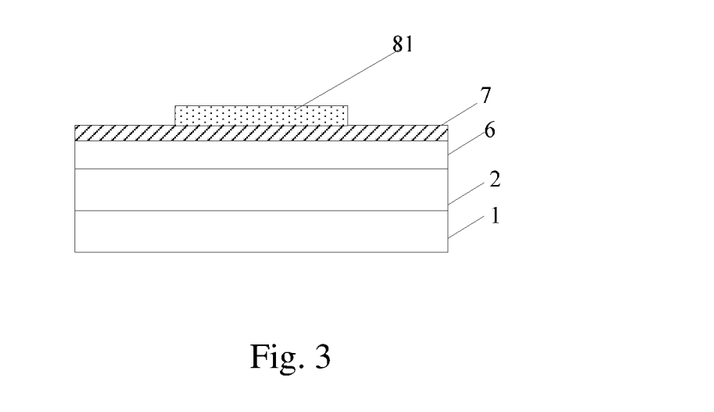
FIG. 3 is a schematic view showing a structure of a second photoresist transition pattern formed by a method according to an embodiment of the present disclosure.
Figure 4:
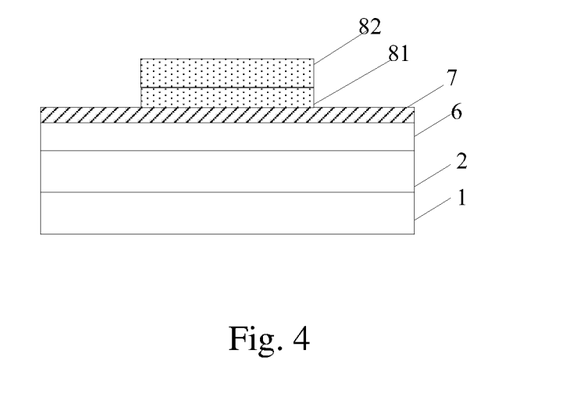
FIG. 4 is a schematic view showing a structure of a second photoresist pattern formed by a method according to an embodiment of the present disclosure.
Figure 5:
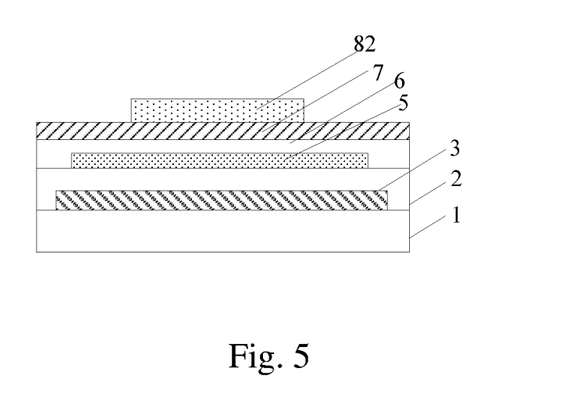
FIG. 5 is a schematic view showing a structure of a first photoresist pattern formed by a method according to an embodiment of the present disclosure.

In the method for preparing the display substrate according to an embodiment of the present disclosure, as shown in FIGS. 3 to 5, a substrate 1 is first provided. The substrate 1 may be a rigid substrate or a flexible substrate, in which the rigid substrate may be a glass substrate or a quartz substrate, and the flexible substrate may be made of polyimide.

A light shielding metal layer 3 is formed on the substrate 1. Specifically, a light-shielding metal layer 3 can be deposited on the substrate 1 by sputtering or thermal evaporation, in which the light-shielding metal layer 3 can be metals, such as Cu, Al, Ag, Mo, Cr, Nd, Ni, Mn, Ti, Ta, W, and alloys of these metals. The light-shielding metal layer 3 may be a single layer structure, or a multilayer structure, in which the multilayer structure is for example, Cu\Mo, Ti\Cu\Ti, Mo\Al\Mo, etc. One layer of photoresist is coated on the light-shielding metal layer 3, and the photoresist is exposed by using a mask, so that the photoresist forms a photoresist unreserved region and a photoresist reserved region. The photoresist reserved region corresponds to a region in which the pattern of the light-shielding metal layer 3 is located, and the photoresist unreserved region corresponds to a region outside the above pattern. Then, development processing is performed, so that the photoresist in the photoresist unreserved region is completely removed, and the thickness of the photoresist in the photoresist reserved region remains unchanged. The light-shielding metal layer 3 of the photoresist unreserved region is completely etched away by an etching process, and the remaining photoresist is stripped to form a pattern of the light-shielding metal layer 3.

A buffer layer 2 is formed. Specifically, a buffer layer 2 having a thickness of 500 to 5,000 Å may be deposited by plasma enhanced chemical vapor deposition (PECVD). The buffer layer 2 can be selected from oxides, nitrides, or oxynitrides, and the corresponding reaction gases are $SiH_4$, $NH_3$ and $N_2$, or $SiH_2Cl_2$, $NH_3$ and $N_2$.

An active layer 5 is formed. Specifically, one layer of a semiconductor material is deposited. The semiconductor material may be an oxide semiconductor material, such as IGZO, IZO, etc. One layer of photoresist is coated on the semiconductor material, and the photoresist is exposed by using a mask, so that the photoresist forms a photoresist unreserved region and a photoresist reserved region. The photoresist reserved region corresponds to a region in which the pattern of the active layer is located, and the photoresist unreserved region corresponds to a region outside the pattern of the active layer. Then, development processing is performed, so that the photoresist in the photoresist unreserved region is completely removed, and the thickness of the photoresist in the photoresist reserved region remains unchanged. The semiconductor material of the photoresist unreserved region is etched by an etching process to form a pattern of the active layer 5.

A gate insulation layer 6 is formed. Specifically, a gate insulation layer 6 having a thickness of 500 to 5,000 Å may be deposited by plasma enhanced chemical vapor deposition (PECVD). The gate insulation layer 6 can be selected from oxides, nitrides, or oxynitrides, and the corresponding reaction gases are $SiH_4$, $NH_3$ and $N_2$, or $SiH_2Cl_2$, $NH_3$ and $N_2$.

A gate metal layer 7 is formed. Specifically, a gate metal layer having a thickness of about 500 to 4000 Å may be deposited by sputtering or thermal evaporation. The gate metal layer may be metals, such as Cu, Al, Ag, Mo, Cr, Nd, Ni, Mn, Ti, Ta, W, and alloys of these metals. The gate metal layer may be a single layer structure or a multilayer structure, in which the multilayer structure is such as Cu\Mo, Ti\Cu\Ti, Mo\Al\Mo etc.

As shown in FIG. 3, one relatively thin first photoresist layer having good adhesion to the gate metal layer 7 is first coated on the gate metal layer, and the first photoresist layer is exposed and developed to form a second photoresist transition pattern 81. The second photoresist transition pattern 81 locates only at a position corresponding to the gate wiring. Then, as shown in FIGS. 4 and 5, a relatively thick second photoresist layer 82 having poor adhesion to the gate metal layer is coated on the gate metal layer 7. Because the adhesion between the second photoresist layer 82 and the gate metal layer is relatively poor, if the thickness of the second photoresist layer 82 is relatively small, the second photoresist layer 82 will be more easily peeled off from the gate metal layer, so the thickness of the second photoresist layer 82 may be slightly larger than the thickness of the first photoresist layer. The second photoresist layer 82 is exposed and developed, to retain the second photoresist layer 82 located on the second photoresist transition pattern 81 (as shown in FIG. 4) and the second photoresist layer 82 corresponding to the gate electrode 71 (as shown in FIG. 5). The second photoresist transition pattern 81 and the second photoresist layer 82 located on the second photoresist transition pattern 81 in FIG. 4 constitute a second photoresist pattern. The second photoresist layer 82 corresponding to the gate electrode 71 in FIG. 5 constitutes a first photoresist pattern. Since the second photoresist transition pattern 81 is in contact with the gate metal layer 7 in the second photoresist pattern, the adhesion between the second photoresist pattern and the gate metal layer 7 is greater than the adhesion between the first photoresist pattern and the gate metal layer 7

In the embodiment of the present disclosure, the gate metal layer may be made of a metal having a better conductivity such as Cu, and the first photoresist layer and the second photoresist layer are both made of a positive photoresist. The positive photoresist may include: 1) a base material, for example, phenolic resin, etc., which is the skeleton of a positive photoresist and can enhance the strength of the positive photoresist; 2) a photosensitive material, for example, 0-nitrine quinone, etc., which is the main body of the photochemical reaction and becomes soluble in the developer after the photochemical reaction; and 3) a solvent material, such as xylene and various acetates (for example, PGMEA: propylene glycol monomethyl ether acetate), etc., which can adjust the viscosity of the photoresist.

Optionally, the photosensitive material and the solvent material of the first photoresist layer and the second photoresist layer may be the same, but the base materials used may be different. The more the polar groups contained in the base material used, for example, the higher the content of hydroxyl (—OH), carboxyl (—COOH), etc., the worse the adhesion of the photoresist to the metal. In contrast, the less the polar groups contained in the base material used, the better its adhesion to the metal. Therefore, the second photoresist layer has more polar groups in the base material than the first photoresist layer.

Figure 7:
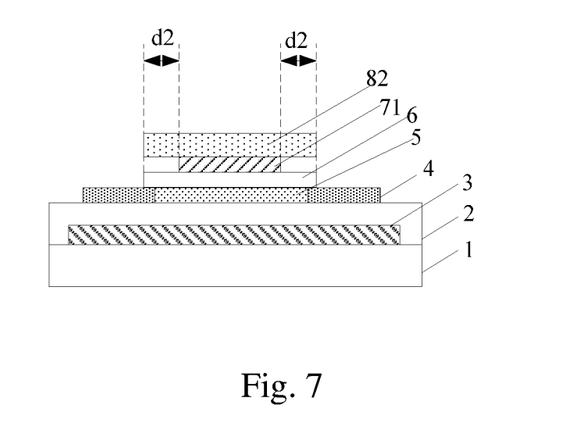
FIG. 7 is a schematic view showing a structure of a gate electrode formed by a method according to an embodiment of the present disclosure.

Then, the gate metal layer 7 is etched by using the first photoresist pattern and the second photoresist pattern as masks. Since adhesion between the first photoresist pattern and the gate metal layer is relatively poor, it is relatively easy for the etching solution in the etching process to enter the angle between the first photoresist pattern and the gate metal layer for lateral etching. As shown in FIG. 7, d2 between the gate electrode 71 formed after the etching and the first photoresist pattern is relatively large, and d2 is a half of a line width difference between the gate electrode 71 and the first photoresist pattern. Since the adhesion between the second photoresist pattern and the gate metal layer 7, it is difficult for the etching solution in the etching process to enter the angle between the second photoresist pattern and the gate metal layer 7 for lateral etching. As shown in FIG. 6, d1 between the gate wiring 72 formed after the etching and the second photoresist pattern is relatively small. d1 is a half of the line width difference between the gate wiring and the second photoresist pattern. Since the line width difference between the gate wiring 72 formed after the etching and the second photoresist pattern is relatively small, it can meet the wiring requirements of the gate wiring and increase the wiring density of the gate wiring.

Then, the gate insulation layer 6 is dry-etched by using the second photoresist pattern and the first photoresist pattern as masks, to form a pattern of the gate insulation layer 6. Since the line width difference between the gate electrode 71 and the remaining first photoresist pattern above is relatively large, the first photoresist pattern is capable of better protecting the gate insulation layer 6 below the gate electrode 71 from being etched, so that the line width difference between the gate electrode 71 and the pattern of the gate insulation layer 6 below will also be relatively large.

After the pattern of the gate insulation layer 6 is formed, the second photoresist pattern and the first photoresist pattern are not stripped, and a conductorization process is performed on the active layer 5. Specifically, the active layer 5 may be subjected to a plasma treatment. As shown in FIG. 7, a conductive active layer 4 is formed at both ends of the active layer 5. Since the line width difference between the gate electrode 71 and the gate insulation layer 6 below is relatively large, the gate insulation layer 6 may have a certain protection limitation effect on the conductorization process of the active layer 5 below, and can effectively avoid the lateral diffusion of He plasma in the channel and the diffusion of the metal atoms of the upper gate electrode 71 into the channel through the two ends of the active layer 5 during the conductorization process, thereby ensuring the stability of the performance of the thin film transistor.

Figure 8:
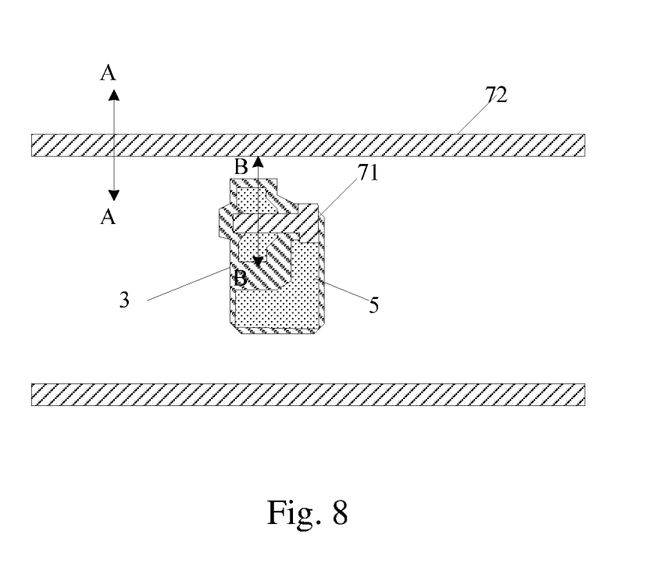
FIG. 8 is a schematic view showing positions of a gate electrode and a gate wiring prepared by a method according to an embodiment of the present disclosure.

Then, the second photoresist pattern and the first photoresist pattern can be peeled off to form a gate wiring 72 and a gate electrode 71 as shown in FIG. 8. FIG. 6 and FIG. 4 are schematic cross-sectional views showing the A-A position during preparation in FIG. 8, and FIGS. 7 and 5 are schematic cross-sectional views showing the B-B position during preparation in FIG. 8.

In another aspect, an embodiment of the present disclosure further provides a display substrate prepared by the method described above.

Likewise, since the display substrate of the present disclosure is prepared by a method according to an embodiment of the present disclosure, the above display substrate meets both the performance requirements of the thin film transistor and the density requirements of the metal wiring.

Optionally, the conductive layer is a gate metal layer, the first conductive pattern is a gate electrode of a thin film transistor, and the second conductive pattern is a gate wiring. After the gate metal layer is etched, the line width difference between the formed gate electrode and the remaining first photoresist pattern above is relatively large, thereby meeting the performance requirements of the thin film transistor; and the line width difference between the formed gate wiring and the remaining second photoresist pattern above is relatively small, thereby meeting the wiring requirements of the gate wiring and improving the product quality of the display substrate.

Optionally, an orthogonal projection of the gate electrode of the thin film transistor on the base substrate of the display substrate falls within an orthogonal projection of the gate insulation layer of the thin film transistor on the base substrate. When the active layer is subjected to a conductorization process, the gate insulation layer may have a certain protection limitation effect on the conductorization process of the active layer below, and can effectively avoid the lateral diffusion of He plasma in the channel and the diffusion of the metal atoms of the upper gate electrode into the channel through the two ends of the active layer during the conductorization process, thereby ensuring the stability of the performance of the thin film transistor.

In yet another aspect, an embodiment of the present disclosure also provides a display device including the display substrate as described above. The display device may include any product or component having a display function, such as a television, a display, a digital photo frame, a mobile phone, and a tablet computer. Optionally, the display device further includes a flexible circuit board, a printed circuit board, and a backplane.

Unless otherwise defined, technical terms or scientific terms used herein have the normal meaning commonly understood by one skilled in the art of the present disclosure. The words "first", "second", and the like used herein do not denote any order, quantity, or importance, but rather merely serve to distinguish different components. The "including", "comprising", and the like used in the present disclosure means that the element or item appeared in front of the word encompasses the element or item and their equivalents listed after the word, and does exclude other elements or items. The word "connected" or "connecting" and the like are not limited to physical or mechanical connections, but may include electrical connections, whether direct or indirect. "On", "under", "left", "right" and the like are only used to represent relative positional relationships, and when the absolute position of the described object is changed, the relative positional relationship may also be changed, accordingly. Moreover, it will be understood that when an element, such as a layer, film, region, or substrate, is referred to as being "on" or "under" another element, the element may be directly "on" or "under" another element, or there may be an intermediate element.

The above description is alternative embodiments of the present disclosure. It should be noted that one skilled in the art would make several improvements and substitutions without departing from the principles of the present disclosure. These improvements and modifications should also be regarded as the protection scope of the present disclosure.

The invention claimed is:

1. A method for preparing a display substrate, comprising:
   forming a conductive layer;
   forming a first photoresist pattern and a second photoresist pattern on the conductive layer, wherein the adhesion between the first photoresist pattern and the conductive layer is less than the adhesion between the second photoresist pattern and the conductive layer; and
   etching the conductive layer by using the first photoresist pattern and the second photoresist pattern as masks to form a first conductive pattern and a second conductive pattern, respectively, wherein a line width difference between the first conductive pattern and the first photoresist pattern is greater than a line width difference between the second conductive pattern and the second photoresist pattern.

2. The method of claim 1, wherein an orthogonal projection of the first conductive pattern on a base substrate of the display substrate falls within an orthogonal projection of the first photoresist pattern on the base substrate, and an orthogonal projection of the second conductive pattern on the base substrate of the display substrate falls within an orthogonal projection of the second photoresist pattern on the base substrate.

3. The method of claim 2, wherein an orthogonal projection of a center axis of the first conductive pattern in an extending direction thereof on the base substrate coincides with an orthogonal projection of a central axis of the first photoresist pattern in an extending direction thereof on the base substrate.

4. The method of claim 2, wherein an orthogonal projection of a central axis of the second conductive pattern in an extending direction thereof on the base substrate coincides with an orthogonal projection of a central axis of the second photoresist pattern in an extending direction thereof on the base substrate.

5. The method of claim 1, wherein components of the first photoresist pattern and the second photoresist pattern comprise a base material, a photosensitive material, and a solvent material, a density of polar groups contained in the base material of a portion of the first photoresist pattern in contact with the conductive layer is greater than a density of polar groups contained in the base material of a portion of the second photoresist pattern in contact with the conductive layer.

6. The method of claim 5, wherein the polar group is a hydroxyl group (—OH).

7. The method of claim 5, wherein the base material in the first photoresist pattern and the second photoresist pattern is a phenol resin containing different amounts of polar groups.

8. The method of claim 1, wherein the forming the first photoresist pattern and the second photoresist pattern on the conductive layer comprises:
coating a first photoresist layer on the conductive layer, and exposing and developing the first photoresist layer to form a second photoresist transition pattern;
coating a second photoresist layer on the conductive layer and the second photoresist transition pattern, wherein an adhesion between the first photoresist layer and the conductive layer is greater than an adhesion between the second photoresist layer and the conductive layer; and
exposing and developing the second photoresist layer to form the first photoresist pattern, wherein the second photoresist transition pattern and the second photoresist layer remaining on the second photoresist transition pattern constitute the second photoresist pattern.

9. The method of claim 1, wherein the conductive layer is a gate metal layer, the first conductive pattern is a gate electrode of a thin film transistor, and the second conductive pattern is a gate wiring.

10. The method of claim 9, wherein the method comprises:
forming an active layer of the thin film transistor;
forming a gate insulation layer, wherein the gate insulation layer covers the active layer;
forming the gate metal layer on the gate insulation layer;
forming the first photoresist pattern and the second photoresist pattern on the gate metal layer;
etching the gate metal layer by using the first photoresist pattern and the second photoresist pattern as masks to form the gate and the gate wiring, respectively;
etching the gate insulation layer by using the first photoresist pattern and the second photoresist pattern as masks to form a pattern of the gate insulation layer;
performing a conductorization process on the active layer using the first photoresist pattern as a mask; and
removing the first photoresist pattern and the second photoresist pattern.

11. The method of claim 1, wherein a line width difference between the first conductive pattern and the first photoresist pattern is 1.5 μm to 2.5 μm, and a line width difference between the second conductive pattern and the second photoresist pattern is 0.5 μm to 1.2 μm.

12. A display substrate, prepared by the method of claim 1.

13. The display substrate of claim 12, wherein the first conductive pattern is a gate electrode of a thin film transistor, and the second conductive pattern is a gate wiring.

14. The display substrate of claim 12, wherein an orthogonal projection of the gate electrode of the thin film transistor on the base substrate of the display substrate falls within an orthogonal projection of the gate insulation layer of the thin film transistor on the base substrate.

15. A display device, comprising the display substrate of claim 12.

16. The method of claim 5, wherein the polar group is a carboxyl group (—COOH).

17. The method of claim 5, wherein the polar group is a hydroxyl group (—OH) and a carboxyl group (—COOH).

* * * * *